United States Patent
Saito et al.

(10) Patent No.: US 8,759,878 B2
(45) Date of Patent: Jun. 24, 2014

(54) NITRIDE SEMICONDUCTOR DEVICE AND METHOD FOR MANUFACTURING SAME

(75) Inventors: Yasunobu Saito, Tokyo (JP); Hidetoshi Fujimoto, Kanagawa-ken (JP); Tetsuya Ohno, Kanagawa-ken (JP); Akira Yoshioka, Kanagawa-ken (JP); Wataru Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/238,684

(22) Filed: Sep. 21, 2011

(65) Prior Publication Data

US 2012/0187413 A1 Jul. 26, 2012

(30) Foreign Application Priority Data

Jan. 26, 2011 (JP) ................. 2011-014280

(51) Int. Cl.
H01L 29/66 (2006.01)
(52) U.S. Cl.
USPC ...... 257/194; 257/76; 257/192; 257/E29.246; 257/E29.31; 257/E29.327
(58) Field of Classification Search
USPC .............. 257/76, 192–194, 199, E29.31, 257/E29.327, E29.246
See application file for complete search history.

(56) References Cited

U.S. PATENT DOCUMENTS

| | | | |
|---|---|---|---|
| 7,705,371 B2 * | 4/2010 | Nakazawa et al. | 257/192 |
| 7,714,359 B2 * | 5/2010 | Nakazawa et al. | 257/192 |
| 8,344,419 B2 * | 1/2013 | Kikkawa | 257/192 |
| 2007/0045670 A1 * | 3/2007 | Kuraguchi | 257/249 |
| 2008/0093626 A1 * | 4/2008 | Kuraguchi | 257/190 |
| 2008/0258243 A1 * | 10/2008 | Kuroda et al. | 257/410 |
| 2010/0314663 A1 * | 12/2010 | Ito et al. | 257/192 |

FOREIGN PATENT DOCUMENTS

| | | |
|---|---|---|
| JP | 2008-010526 | 1/2008 |
| JP | 2008-124262 | 5/2008 |
| JP | 2011-009493 | 1/2011 |

OTHER PUBLICATIONS

Akira Yoshioka, et al., "Fabrication and evaluation of GaN-HEMT with recess-structures formed by selective-area-growth method" Extended Abstracts (the 70th Autumn Meeting, 2009) The Japan Society of Applied Physics, 8p-TC-4, p. 1302.

* cited by examiner

*Primary Examiner* — Kyoung Lee
*Assistant Examiner* — Ratisha Mehta
(74) *Attorney, Agent, or Firm* — Patterson & Sheridan, LLP

(57) ABSTRACT

According to one embodiment, a nitride semiconductor device includes a first semiconductor, a second semiconductor layer, a third semiconductor layer, a fourth semiconductor layer, a first electrode, a second electrode and a third electrode. The first, second and fourth semiconductor layers include a nitride semiconductor. The second semiconductor layer is provided on the first semiconductor layer, has a band gap not less than that of the first semiconductor layer. The third semiconductor layer is provided on the second semiconductor layer. The third semiconductor layer is GaN. The fourth semiconductor layer is provided on the third semiconductor layer to have an interspace on a part of the third semiconductor layer, has a band gap not less than that of the second semiconductor layer. The first electrode is provided on a portion of the third semiconductor layer. The fourth semiconductor layer is not provided on the portion.

10 Claims, 10 Drawing Sheets

NITRIDE SEMICONDUCTOR DEVICE AND METHOD FOR MANUFACTURING SAME

CROSS-REFERENCE TO RELATED APPLICATIONS

This application is based upon and claims the benefit of priority from the prior Japanese Patent Application No. 2011-014280, filed on Jan. 26, 2011; the entire contents of which are incorporated herein by reference.

FIELD

Embodiments described herein relate generally to a nitride semiconductor and a method for manufacturing the same.

BACKGROUND

Semiconductor devices using a nitride semiconductor can improve the trade-off relationship between the breakdown voltage and the ON resistance to achieve a decreased ON resistance and an increased breakdown voltage because of the excellent material characteristics thereof. Examples of the structure of such a nitride semiconductor device include a field effect transistor using a hetero-structure of AlGaN and GaN. When it is attempted to achieve normally OFF operation in the structure, a recess gate structure is used in which an AlGaN layer below a gate electrode is made thinner than the other portions by etching. Further improvement is required in order to obtain stable characteristics in such a nitride semiconductor device.

DETAILED DESCRIPTION

Figure 1:
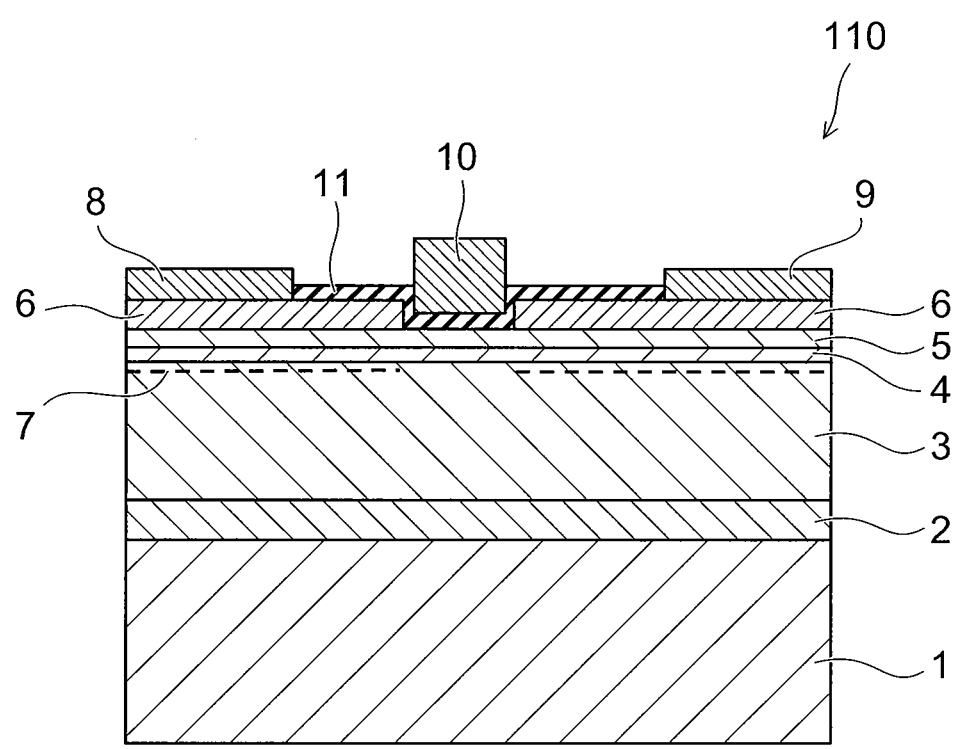
FIG. 1 is a schematic view illustrating the configuration of a nitride semiconductor device according to a first embodiment.

In general, according to one embodiment, a nitride semiconductor device includes a first semiconductor, a second semiconductor layer, a third semiconductor layer, a fourth semiconductor layer, a first electrode, a second electrode and a third electrode. The first semiconductor layer includes a nitride semiconductor. The second semiconductor layer is provided on the first semiconductor layer, has a band gap not less than a band gap of the first semiconductor layer, and includes a nitride semiconductor. The third semiconductor layer is provided on the second semiconductor layer, the third semiconductor layer being GaN. The fourth semiconductor layer is provided on the third semiconductor layer to have an interspace on a part of the third semiconductor layer, has a band gap not less than a band gap of the second semiconductor layer, and includes a nitride semiconductor. The first electrode is provided on a portion of the third semiconductor layer, the fourth semiconductor layer being not provided on the portion. The second electrode is provided on one side of the first electrode on the fourth semiconductor layer and joined to the fourth semiconductor layer by ohmic junction. The third electrode is provided on another side of the first electrode on the fourth semiconductor layer and joined to the fourth semiconductor layer by ohmic junction.

In general, according to one embodiment, a method is disclosed for manufacturing a nitride semiconductor device. The method can include forming a first semiconductor layer including a nitride semiconductor, a second semiconductor layer provided on the first semiconductor layer, and a third semiconductor layer provided on the second semiconductor layer on a support substrate. The second semiconductor layer has a band gap not less than a band gap of the first semiconductor layer, and includes a nitride semiconductor. The third semiconductor layer is GaN. The method can include forming a fourth semiconductor layer provided on the third semiconductor layer to have an interspace on a part of the third semiconductor layer. The fourth semiconductor layer has a band gap not less than a band gap of the second semiconductor layer, and includes a nitride semiconductor. The method can include forming a first electrode on a portion of the third semiconductor layer. The fourth semiconductor layer is not formed on the portion. In addition, the method can include forming a second electrode on one side of the first electrode on the fourth semiconductor layer and a third electrode on another side of the first electrode on the fourth semiconductor layer.

Various embodiments will be described hereinafter with reference to the accompanying drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification of the application and the drawings, components similar to those described in regard to a drawing thereinabove are marked with the same reference numerals, and a detailed description is omitted as appropriate.

First Embodiment

FIG. 1 is a schematic view illustrating the configuration of a nitride semiconductor device according to a first embodiment.

As shown in FIG. 1, a nitride semiconductor device 110 according to the first embodiment includes a first semiconductor layer 3, a second semiconductor layer 4, a third semiconductor layer 5, and a fourth semiconductor layer 6. Furthermore, the nitride semiconductor device 110 includes a first electrode 10, a second electrode 8, and a third electrode 9.

In the nitride semiconductor device 110, the first semiconductor layer 3 is formed via a buffer layer 2 formed on a support substrate 1. Here, for convenience of description, the direction from the first semiconductor layer 3 toward the second semiconductor layer 4 is referred to as upward (the upper side), the opposite direction is referred to as downward (the lower side).

The first semiconductor layer 3 includes a nitride semiconductor. The second semiconductor layer 4 is provided on the first semiconductor layer 3. The second semiconductor layer 4 has a band gap not less than the band gap of the first semiconductor layer 3 and includes a nitride semiconductor. The third semiconductor layer 5 is provided on the second semiconductor layer 4. The third semiconductor layer 5 is a nitride semiconductor and includes a smaller amount of aluminum than the second semiconductor layer 4. The fourth semiconductor layer 6 is provided on the third semiconductor layer 5 so as to have an interspace on a part of the third semiconductor layer 5. The fourth semiconductor layer 6 has a band gap not less than the band gap of the second semiconductor layer 4 and includes a nitride semiconductor.

The nitride semiconductor device 110 shown in FIG. 1 is a normally OFF field effect transistor.

In the specification, "nitride semiconductor" includes all semiconductors expressed by the chemical formula of $B_\alpha In_\beta Al_\gamma Ga_{1-\alpha-\beta-\gamma}N$ ($0 \leq \alpha \leq 1$, $0 \leq \beta \leq 1$, $0 \leq \gamma \leq 1$, $0 \leq \alpha+\beta+\gamma \leq 1$) in which composition ratios $\alpha$, $\beta$, and $\gamma$ are changed in the respective ranges. Furthermore, in the chemical formula mentioned above, those further including a group V element other than N (nitrogen), those further including various elements added in order to control various properties such as the conduction type, and those further including various elements unintendedly included are also included in the "nitride semiconductor."

In the embodiment, GaN and AlGaN, which are group III-V nitride semiconductors, are used as examples of the nitride semiconductor.

An undoped $Al_X Ga_{1-X}N$ ($0 \leq X \leq 1$) is used for the first semiconductor layer 3. In the embodiment, the first semiconductor layer 3 is GaN. The first semiconductor layer 3 functions as a channel layer. Here, "undoped" refers to a state where intended impurity doping is not performed.

An undoped or an n-type $Al_Y Ga_{1-Y}N$ ($0 \leq Y \leq 1$, $X \leq Y$) is used for the second semiconductor layer 4. As an example, in the embodiment, the second semiconductor layer 4 is AlGaN with an Al content of 25 percent (%).

GaN, for example, which is a nitride semiconductor not including highly reactive Al, is used for the third semiconductor layer 5. GaN is chemically stable and less oxidizable than AlGaN, and is a material that bonds to other impurities less easily. The third semiconductor layer 5 is formed on the second semiconductor layer 4 that is AlGaN. The second semiconductor layer 4 and the third semiconductor layer 5 have a thickness not causing two-dimensional electron gas 7 at the interface between the third first semiconductor layer 3 and the second semiconductor layer 4.

An undoped or an n-type $Al_Z Ga_{1-Z}N$ ($0 \leq Z \leq 1$, $X \leq Z$) is used as the fourth semiconductor layer 6. As an example, in the embodiment, the fourth semiconductor layer 6 is AlGaN with an Al content of 25%. In the embodiment, the fourth semiconductor layer 6 has the same band gap as the second semiconductor layer 4.

The fourth semiconductor layer 6 is provided on the third semiconductor layer 5 so as to have an interspace on a part of the third semiconductor layer 5. Specifically, the fourth semiconductor layer 6 is provided in a region other than the region where the first electrode 10 described later will be formed. The fourth semiconductor layer 6 has a thickness enough to generate the two-dimensional electron gas 7 at the interface between the first semiconductor layer 3 and the second semiconductor layer 4.

The first electrode 10 is provided above a portion of the third semiconductor layer 5 where the fourth semiconductor layer 6 is not provided. The first electrode 10 is formed via an insulating film 11 provided on the third semiconductor layer 5. In the embodiment, the first electrode 10 is a gate electrode. The gate electrode is a MIS (metal insulator semiconductor) gate electrode. The structure of the gate electrode is not limited to MIS but may be a Schottky gate electrode in which the third semiconductor layer 5 and the first electrode 10 are joined by Schottky junction.

The second electrode 8 is provided on one side of the first electrode 10 on the fourth semiconductor layer 6. The second electrode 8 is joined to the fourth semiconductor layer 6 by ohmic junction. In the embodiment, the second electrode 8 is a source electrode.

The third electrode 9 is provided on the other side (the opposite side to the side where the second electrode 8 is provided) of the first electrode 10 on the fourth semiconductor layer 6. The third electrode 9 is joined to the fourth semiconductor layer 6 by ohmic junction. In the embodiment, the third electrode 9 is a drain electrode.

The nitride semiconductor device 110 thus configured has a recess structure in which the semiconductor layer immediately below the first electrode 10 that is the gate electrode is thinner than the semiconductor layer immediately below the second electrode 8 and the third electrode 9 that are the source electrode and the drain electrode. In the recess structure, since the second semiconductor layer 4 of AlGaN and the third semiconductor layer 5 of GaN existing below the first electrode 10 have a small thickness, the two-dimensional electron gas 7 is not generated at the interface between the first semiconductor layer 3 that is the channel layer and the second semiconductor layer 4. Thus, the nitride semiconductor device 110 forms a normally OFF field effect transistor.

Furthermore, the portions other than the recess structure have a hetero-structure of AlGaN and GaN, and can achieve a low resistance.

This can realize a normally OFF nitride semiconductor device with a low resistance and a high breakdown voltage.

Figure 2A:
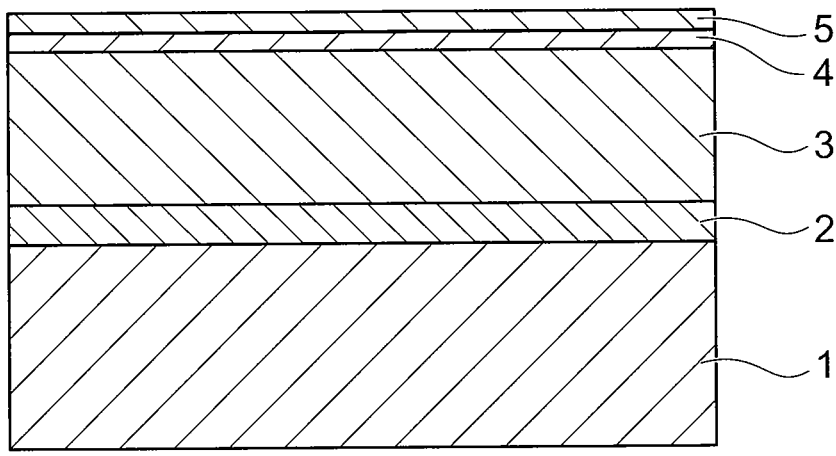
FIG. 2A to FIG. 4B are schematic cross-sectional views illustrating a method for manufacturing the nitride semiconductor device according to the first embodiment.

FIG. 2A to FIG. 4B are schematic cross-sectional views illustrating a method for manufacturing the nitride semiconductor device according to the first embodiment. First, as shown in FIG. 2A, the buffer layer 2 of, e.g., AlN is formed on the support substrate 1 of, e.g., SiC. Next, the first semiconductor layer 3 of, e.g., GaN, the second semiconductor layer 4 of, e.g., AlGaN thereon, and the third semiconductor layer 5 of, e.g., GaN thereon are formed on the buffer layer 2. The first semiconductor layer 3, the second semiconductor layer 4, and the third semiconductor layer 5 are continuously formed by epitaxial growth. In other words, the workpiece is not taken out of the furnace of epitaxial growth until the first semiconductor layer 3 to the third semiconductor layer 5 are formed.

Figure 2B:
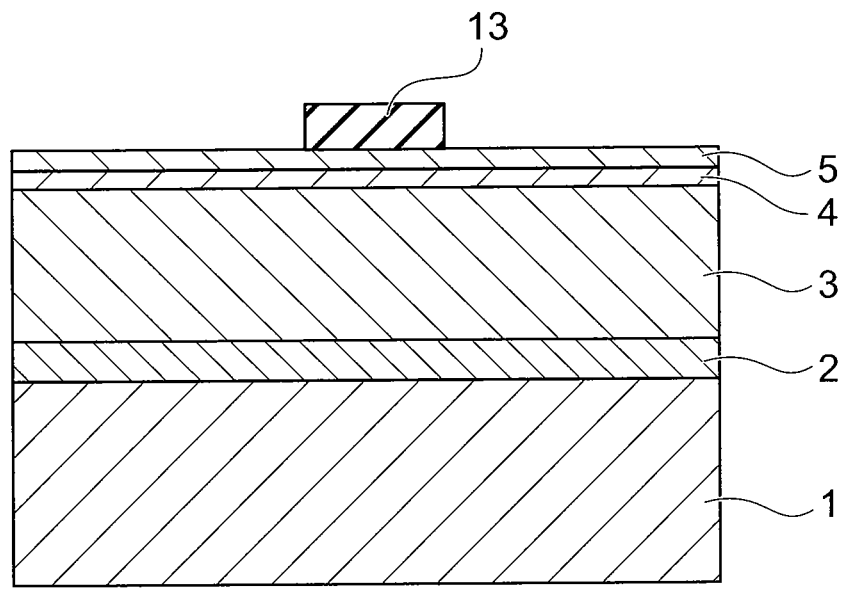

Next, as shown in FIG. 2B, the workpiece is taken out of the furnace of epitaxial growth in a state where components up to the third semiconductor layer 5 are formed, and an insulating film 13 is formed on the third semiconductor layer 5. The insulating film 13 is, for example, $SiO_2$. In the insulating film 13, the portion where the fourth semiconductor layer 6 described later will be formed are removed, and only the portion where the first electrode 10 will be formed is left.

Figure 3A:
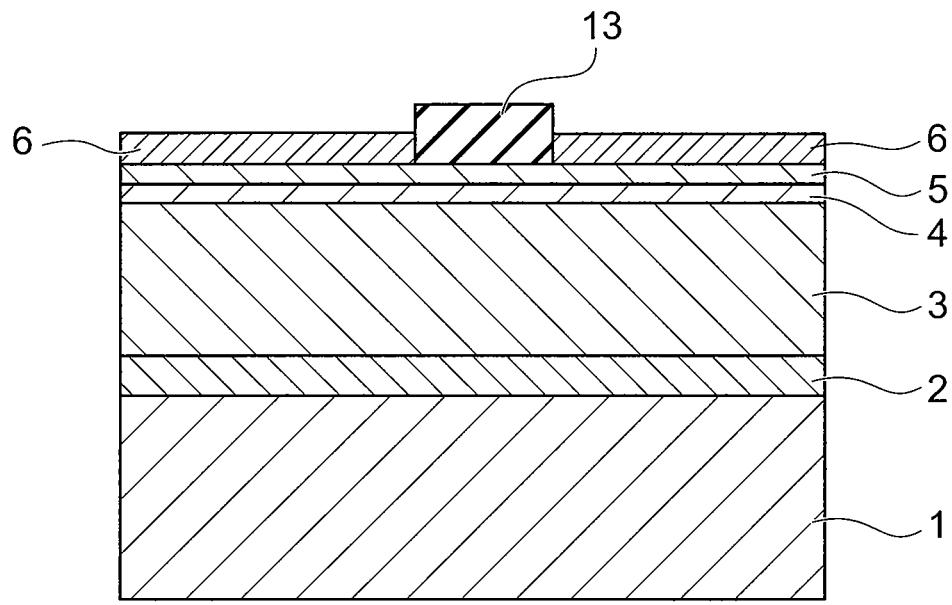
Figure 3B:
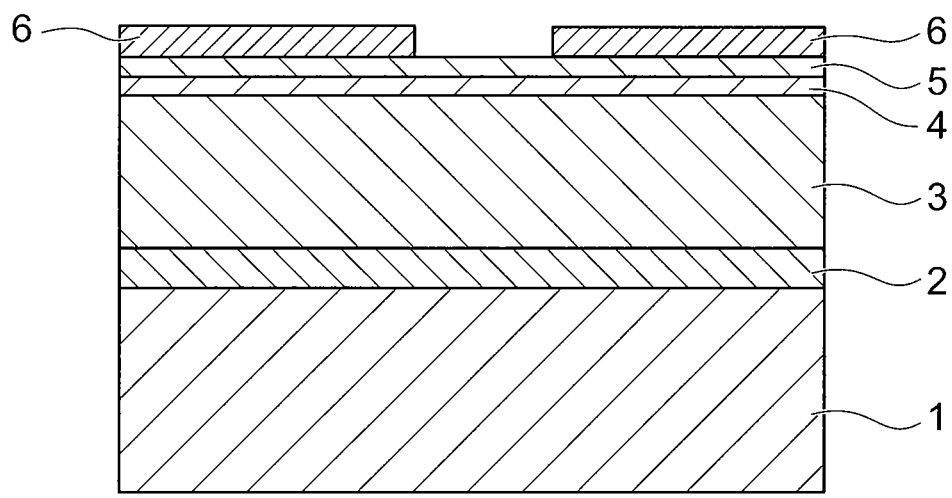

Next, as shown in FIG. 3A, the insulating film 13 is used as a mask member to form the fourth semiconductor layer 6 of, e.g., AlGaN on the third semiconductor layer 5. The fourth semiconductor layer 6 is formed by epitaxial growth in a portion other than the insulating film 13. After the fourth semiconductor layer 6 is formed, the insulating film 13 is removed as shown in FIG. 3B.

Figure 4A:
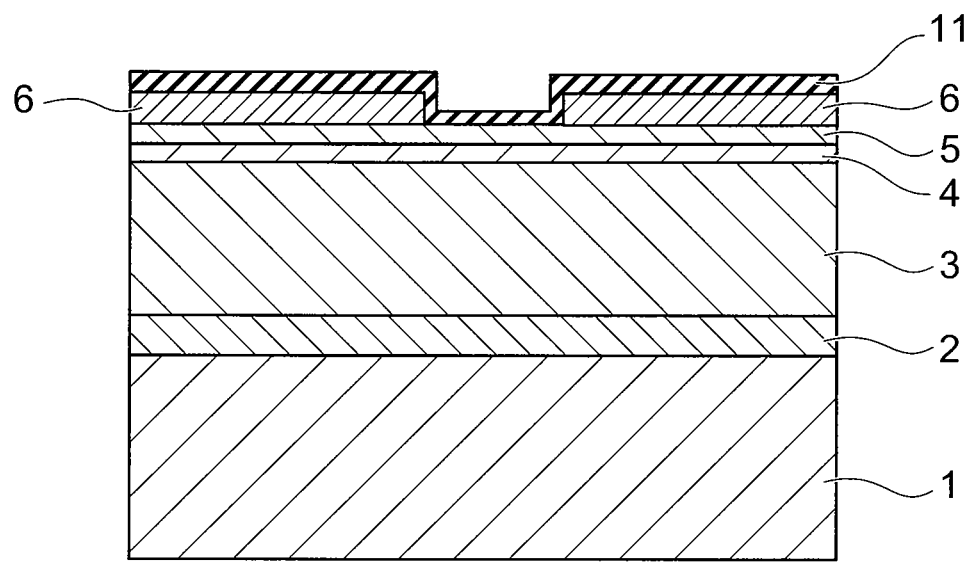
Figure 4B:
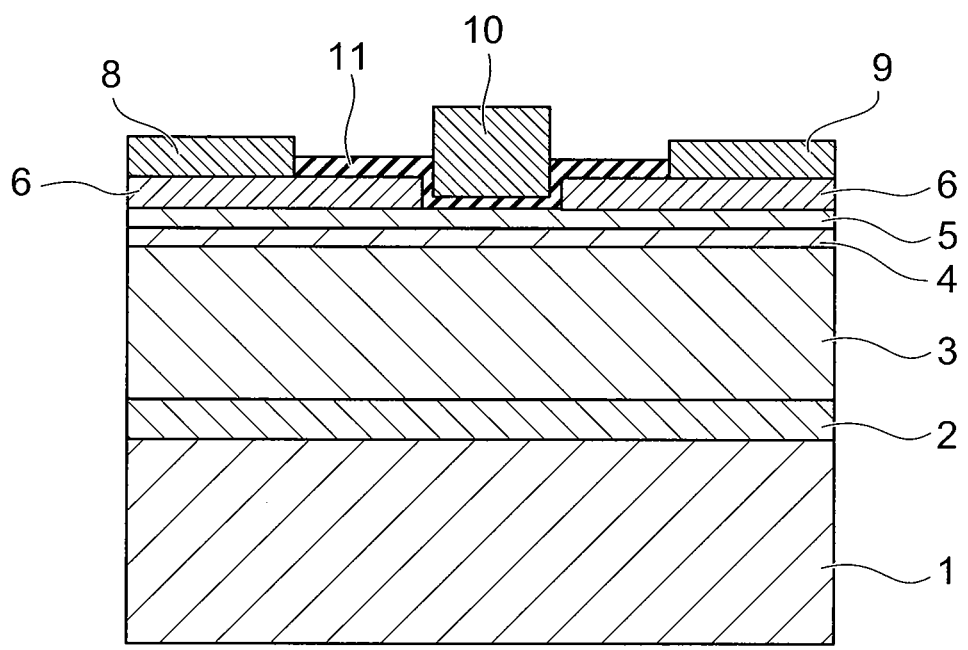

Next, as shown in FIG. 4A, the insulating film 11 is formed so as to cover the fourth semiconductor layer 6 and the exposed portion of the third semiconductor layer 5. After that, as shown in FIG. 4B, parts of the insulating film 11 on the fourth semiconductor layer 6 are removed, and the first electrode 10 that is the gate electrode is formed in a portion where the fourth semiconductor layer 6 is not formed. Then, the second electrode 8 that is the source electrode and the third electrode 9 that is the drain electrode are formed on portions where the parts of the insulating film 11 on the fourth semiconductor layer 6 are removed (the exposed portions of the fourth semiconductor layer 6). This completes the nitride semiconductor device 110.

In the nitride semiconductor device 110 according to the embodiment, the thickness of the second semiconductor layer (AlGaN) 4 that determines the threshold of the field effect transistor and the thickness of the third semiconductor layer (GaN) 5 are accurately determined by the conditions of epitaxial growth. Therefore, the threshold of the field effect transistor can be made uniform as compared to the case where a recess structure is formed by the etching of semiconductor layers.

Furthermore, since the fourth semiconductor layer (AlGaN) 6 formed in a portion other than the region where the first electrode 10 that is the gate electrode is formed is formed thick by regrowth, the two-dimensional electron gas 7 is generated at the interface between the first semiconductor layer (GaN) 3 and the second semiconductor layer (AlGaN) 4 corresponding to this portion, and a low resistance can be achieved.

In the nitride semiconductor device 110 according to the embodiment, the first semiconductor layer 3 to the third semiconductor layer 5 grow epitaxially in a continuous manner without being taken out of the furnace. Hence, it is after GaN is formed at the uppermost layer (the uppermost surface) of the stacked body that the stacked body of semiconductor layers is taken out of the furnace. GaN is more chemically stable and less oxidizable than AlGaN. Therefore, in the case where the stacked body is formed and then temporarily taken out of the furnace, and the insulating film 13 that is a mask member is formed, after which the workpiece is again put into the furnace to epitaxially grow the fourth semiconductor layer 6, the fourth semiconductor layer 6 that is AlGaN can be grown in a crystalline manner on the GaN which is less susceptible to oxidization.

Here, since Al has high reactivity, if the workpiece is taken out of the furnace in a state where the uppermost layer of the stacked body is AlGaN, a thin oxide film is easily formed on the surface of the AlGaN layer, or bonding of the AlGaN with an impurity easily occurs. Consequently, a crystal defect or a trap level resulting from a crystal defect is easily formed in the semiconductor layer formed on the AlGaN. If such a trap level exists, a carrier may be trapped or released to cause a characteristic variation. Furthermore, a conduction path may be formed via a trap to cause an increase in the leakage current or a decrease in the breakdown voltage.

In the nitride semiconductor device 110 according to the embodiment, since the workpiece is taken out of the furnace in a state where the uppermost layer of the stacked body is hardly oxidizable GaN, it is difficult for a crystal defect to be generated in the layer that is formed on the GaN by epitaxial growth performed again. Such a trap level is less easily formed, and the threshold variation of the field effect transistor can be suppressed. Therefore, a nitride semiconductor device 110 with a limited risk of characteristic abnormality and characteristic variation can be obtained.

Second Embodiment

Figure 5:
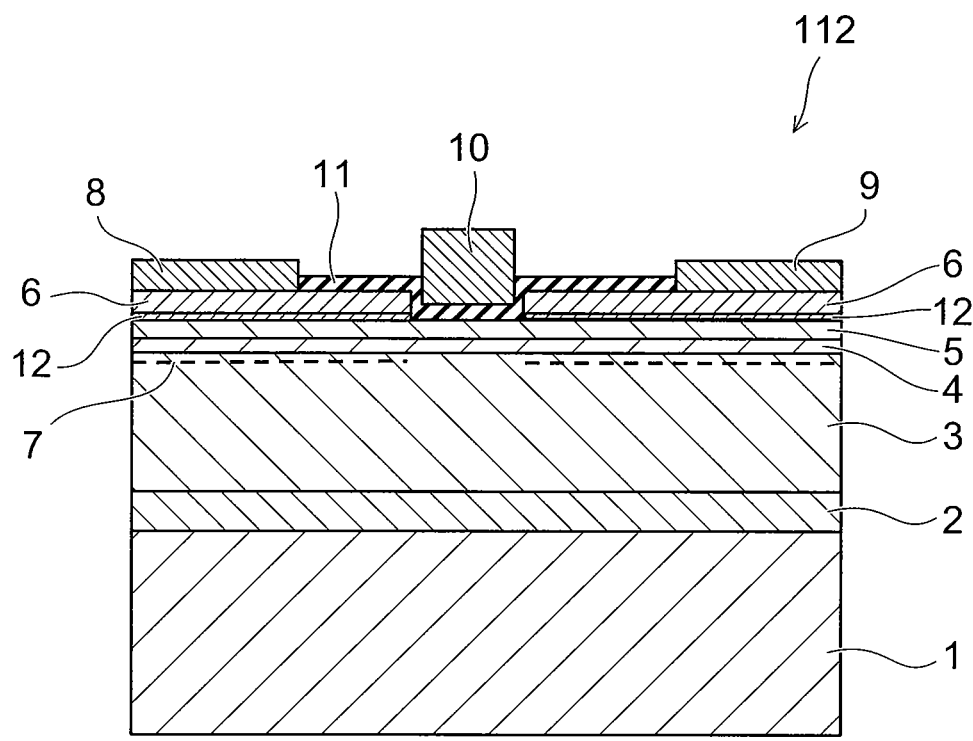
FIG. 5 is a schematic cross-sectional view illustrating a nitride semiconductor device according to a second embodiment.

FIG. 5 is a schematic cross-sectional view illustrating a nitride semiconductor device according to a second embodiment.

In regard to a nitride semiconductor device 112 according to the second embodiment, a description is given mainly about the difference with the nitride semiconductor device 110 according to the first embodiment.

The nitride semiconductor device 112 includes a fifth semiconductor layer 12 between the third semiconductor layer 5 and the fourth semiconductor layer 6.

The fifth semiconductor layer 12 includes an n-type nitride semiconductor. In the embodiment, AlGaN doped to an n type is used as an example. In the case where the fourth semiconductor layer 6 is doped to an n type, the doping concentration of the fifth semiconductor layer 12 is higher than the doping concentration of the fourth semiconductor layer 6.

The doping concentration of the fifth semiconductor layer 12 is preferably not less than $1 \times 10^{18}$ cm$^{-3}$, for example.

The fifth semiconductor layer 12 is formed on the third semiconductor layer 5 by epitaxial growth. The fourth semiconductor layer 6 is continuously formed on the fifth semiconductor layer 12 by epitaxial growth.

Providing the fifth semiconductor layer 12 allows the trap level at the regrowth interface to be compensated. That is, also in the case where the fourth semiconductor layer 6 is grown in a crystalline manner on the third semiconductor layer 5 as in the case of the nitride semiconductor device 110 according to the first embodiment, there is a possibility that trap levels will be formed in a small number at the regrowth interface. By providing the fifth semiconductor layer 12 that is a highly doped layer between the third semiconductor layer 5 and the fourth semiconductor layer 6, the trap level at the regrowth interface can be compensated.

That is, the fifth semiconductor layer 12 facilitates the re-release of carriers trapped. Furthermore, since the fifth semiconductor layer 12 prevents an electric field from being applied to the regrowth interface, carrier trapping occurs less easily. Therefore, a nitride semiconductor device 112 with a limited risk of characteristic variation can be obtained.

If the fifth semiconductor layer 12 that is a highly doped layer has a large thickness, a conduction path is produced via the highly doped layer, which leads to an increase in the leakage current and a decrease in the threshold voltage. Therefore, the thickness of the fifth semiconductor layer 12 needs to be set so that the fifth semiconductor layer 12 may be depleted and include no free carrier. Specifically, the thickness of the fifth semiconductor layer 12 is preferably five nanometers (nm) or less.

Third Embodiment

Figure 6:
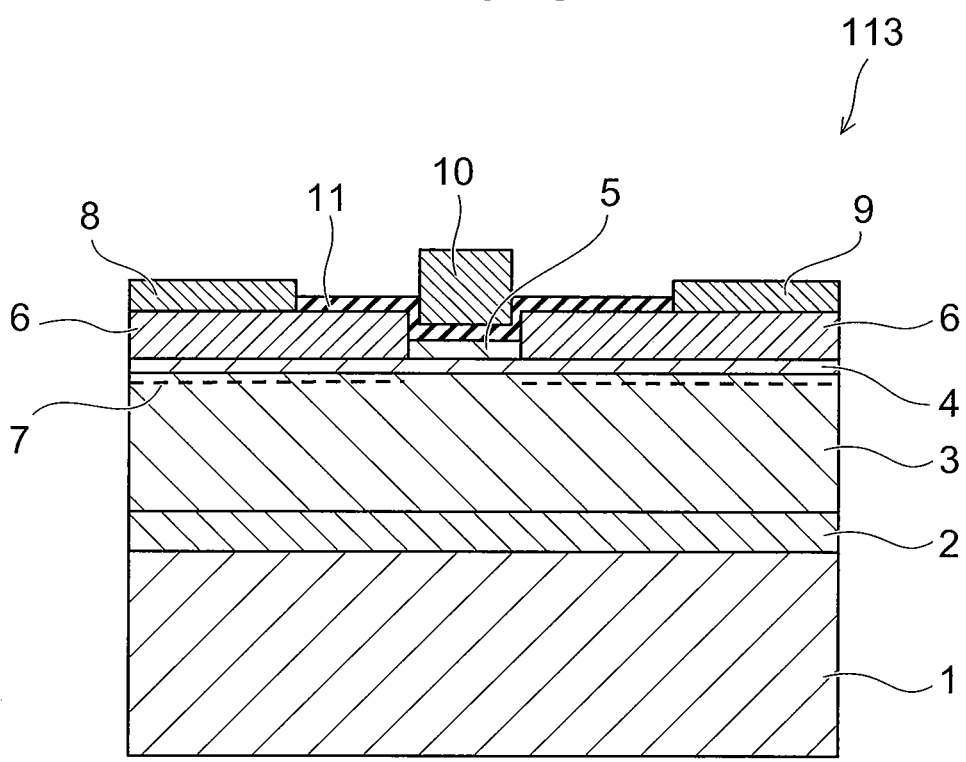
FIG. 6 is a schematic cross-sectional view illustrating the configuration of a nitride semiconductor device according to a third embodiment.

FIG. 6 is a schematic cross-sectional view illustrating the configuration of a nitride semiconductor device according to a third embodiment.

In regard to a nitride semiconductor device 113 according to the third embodiment, a description is given mainly about the difference with the nitride semiconductor device 110 according to the first embodiment.

In the nitride semiconductor device 113 according to the third embodiment, the third semiconductor layer 5 is provided on part of the second semiconductor layer 4.

The fourth semiconductor layer 6 is provided on both sides of the third semiconductor layer 5 on the second semiconductor layer 4.

In the nitride semiconductor device 113 according to the third embodiment, the third semiconductor layer 5 is not provided between the second semiconductor layer 4 and the fourth semiconductor layer 6. Therefore, the ohmic resistance between the second electrode 8 that is the source electrode and the third electrode 9 that is the drain electrode, and the fourth semiconductor layer 6 and the second semiconductor layer 4 can be reduced as compared to the case where the third semiconductor layer 5 is interposed.

FIG. 7A to FIG. 10 are schematic cross-sectional views illustrating a method for manufacturing the nitride semiconductor device according to the third embodiment.

Figure 7A:
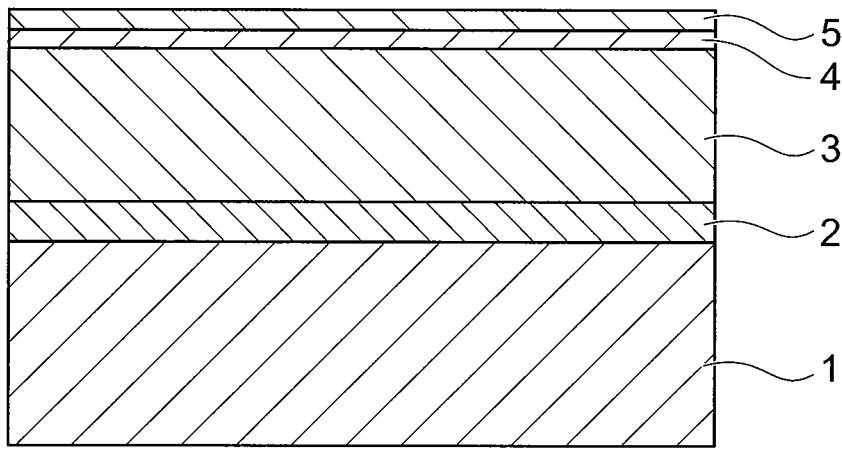
FIG. 7A to FIG. 10 are schematic cross-sectional views illustrating a method for manufacturing the nitride semiconductor device according to the third embodiment.

First, as shown in FIG. 7A, the buffer layer 2 of, e.g., AlN is formed on the support substrate 1 of, e.g., SiC. Next, the first semiconductor layer 3 of, e.g., GaN, the second semiconductor layer 4 of, e.g., AlGaN thereon, and the third semiconductor layer 5 of, e.g., GaN thereon are formed on the buffer layer 2. The first semiconductor layer 3, the second semiconductor layer 4, and the third semiconductor layer 5 are continuously formed by epitaxial growth. In other words, the workpiece is not taken out of the furnace of epitaxial growth until the first semiconductor layer 3 to the third semiconductor layer 5 are formed.

Figure 7B:
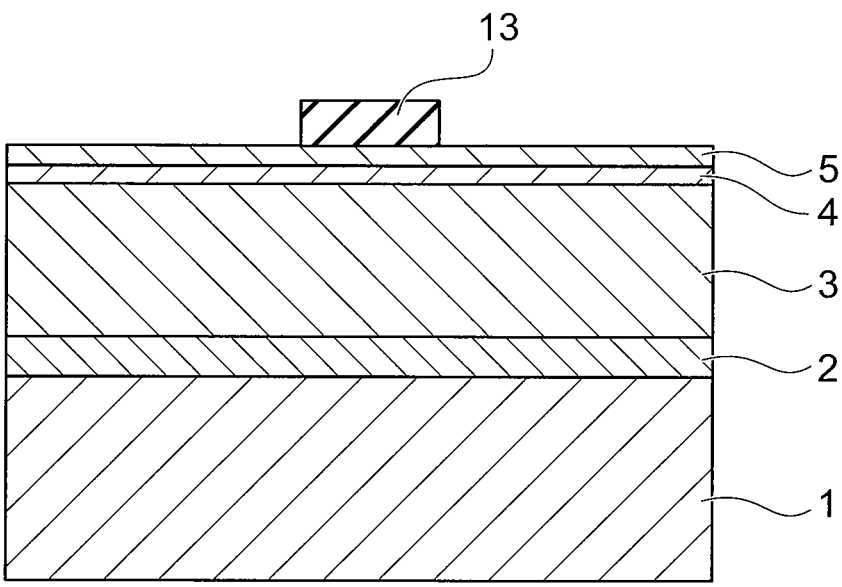

Next, as shown in FIG. 7B, the workpiece is taken out of the furnace of epitaxial growth in a state where components up to the third semiconductor layer 5 are formed, and the insulating film 13 is formed on the third semiconductor layer 5. The insulating film 13 is, for example, $SiO_2$. In the insulating film 13, the portion where the fourth semiconductor layer 6 described later will be formed is removed and only the portion where the first electrode 10 will be formed is left.

Figure 8A:
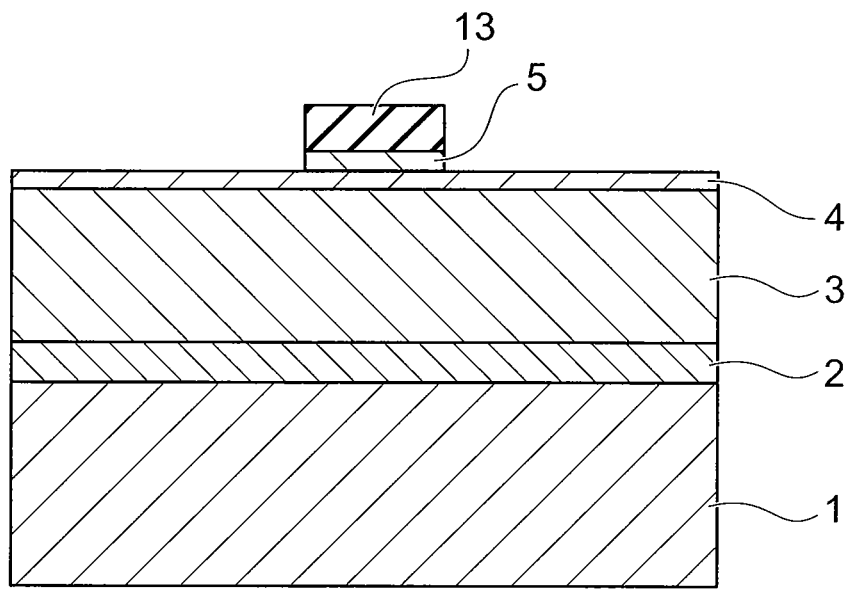

Next, as shown in FIG. 8A, the insulating film 13 is used as a mask member to selectively etch the third semiconductor layer 5. The selective etching of the third semiconductor layer 5 is performed by, for example, heat treatment in a mixed atmosphere of hydrogen and ammonia. This removes the portions other than the portion masked with the insulating film 13 of the third semiconductor layer 5.

Figure 8B:
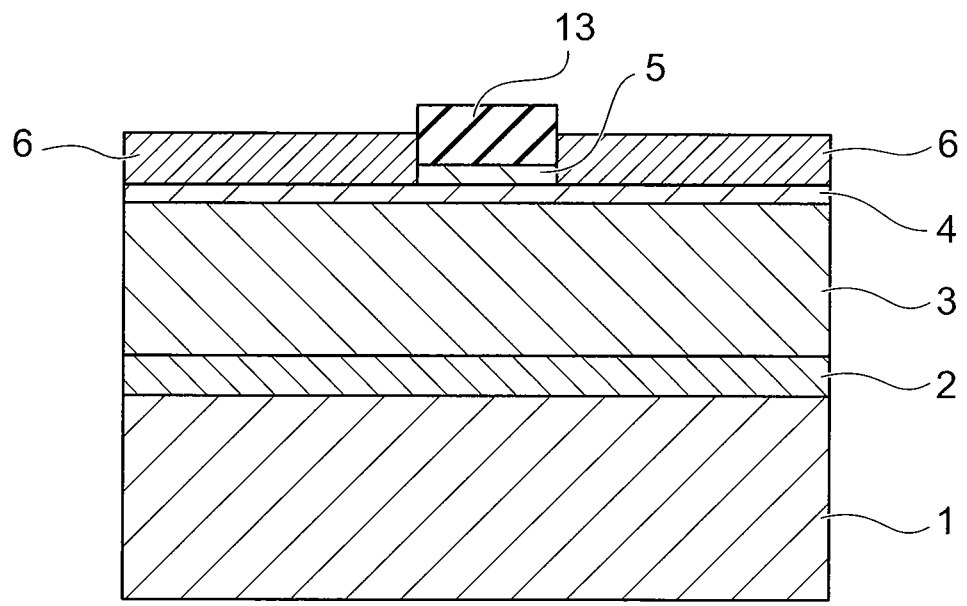
Figure 9A:
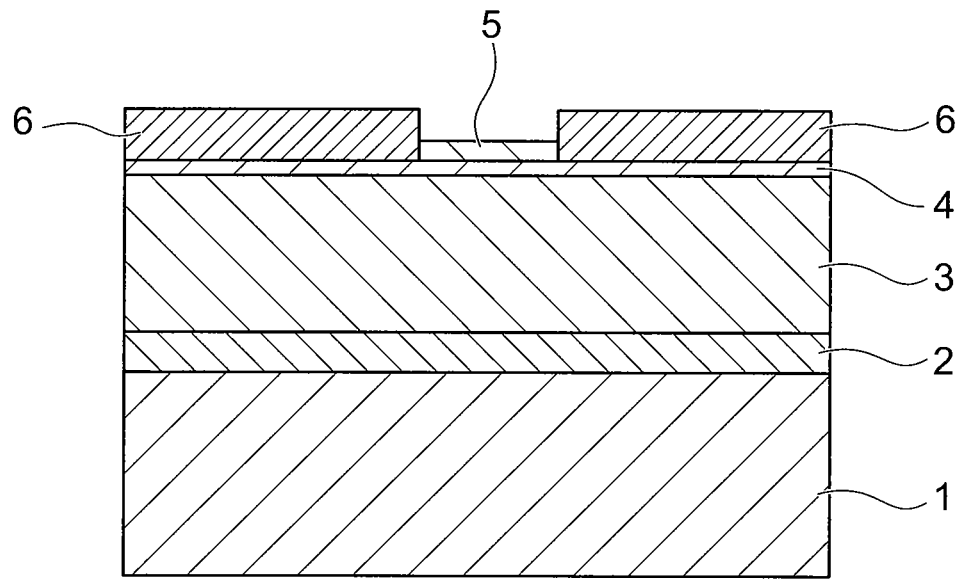

Next, as shown in FIG. 8B, the insulating film 13 is used as a mask member to form the fourth semiconductor layer 6 of, e.g., AlGaN on the third semiconductor layer 4. The fourth semiconductor layer 6 is formed by epitaxial growth on the exposed portion other than the insulating film 13 of the second semiconductor layer 4. After the fourth semiconductor layer 6 is formed, the insulating film 13 is removed as shown in FIG. 9A.

Figure 9B:
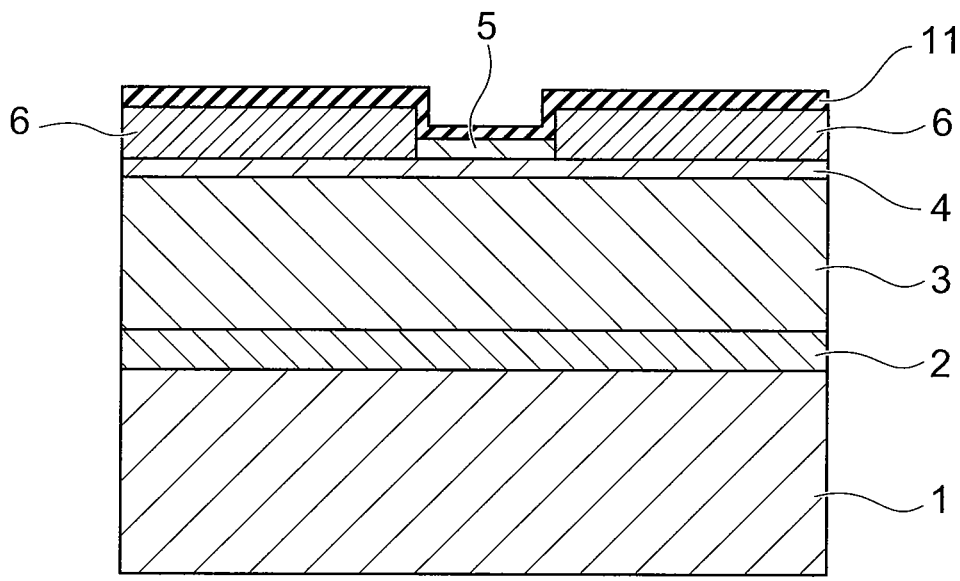
Figure 10:
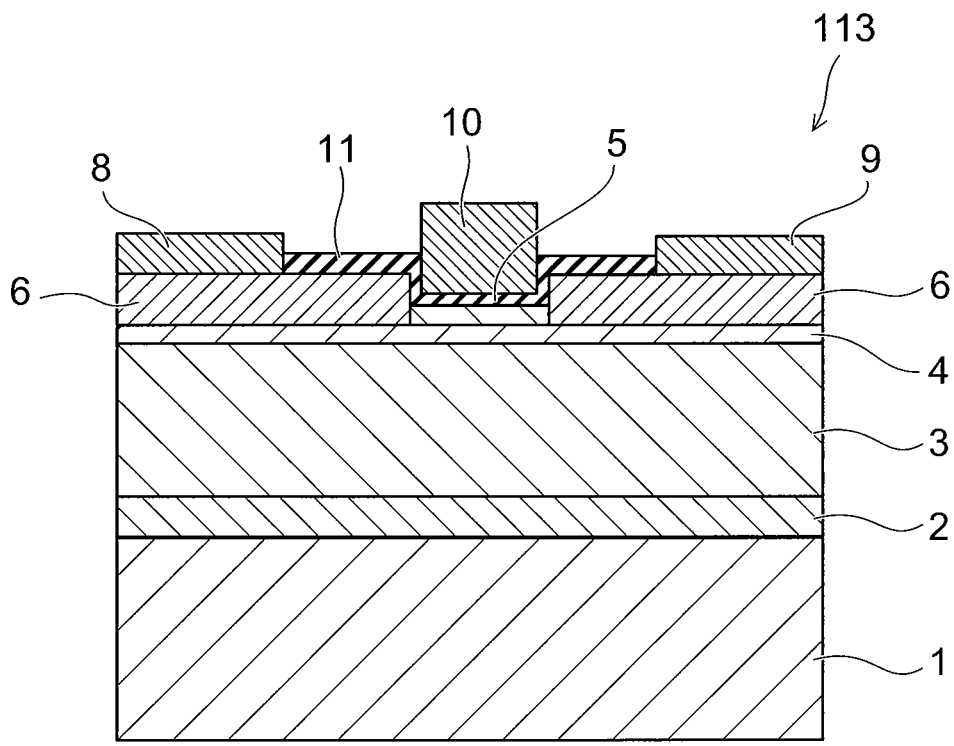

Next, as shown in FIG. 9B, the insulating film 11 is formed so as to cover the fourth semiconductor layer 6 and the exposed portion of the third semiconductor layer 5. After that, as shown in FIG. 10, parts of the insulating film 11 on the fourth semiconductor layer 6 are removed, and the first electrode 10 that is the gate electrode is formed in a portion where the fourth semiconductor layer 6 is not formed. Then, the second electrode 8 that is the source electrode and the third electrode 9 that is the drain electrode are formed on portions where the parts of the insulating film 11 on the fourth semiconductor layer 6 are removed (the exposed portions of the fourth semiconductor layer 6). Thereby, the nitride semiconductor device 113 is completed.

Also in the nitride semiconductor device 113 according to the third embodiment, similarly to the nitride semiconductor device 110 according to the first embodiment, since the second semiconductor layer 4 of AlGaN and the third semiconductor layer 5 of GaN below the first electrode 10 have a small thickness, the two-dimensional electron gas 7 is not generated at the interface between the first semiconductor layer 3 that is the channel layer and the second semiconductor layer 4. Thus, the nitride semiconductor device 113 forms a normally OFF field effect transistor. The thickness of the second semiconductor layer (AlGaN) 4 that determines the threshold of the field effect transistor and the thickness of the third semiconductor layer (GaN) 5 are accurately determined by the conditions of epitaxial growth. Therefore, the threshold of the field effect transistor can be made uniform as compared to the case where a recess structure is formed by the etching of semiconductor layers.

Furthermore, since the fourth semiconductor layer (AlGaN) 6 formed in a portion other than the region where the first electrode 10 that is the gate electrode is formed is formed thick by regrowth, the two-dimensional electron gas 7 is generated at the interface between the first semiconductor layer (GaN) 3 and the second semiconductor layer (AlGaN) 4 corresponding to this portion, and a low resistance can be achieved.

Moreover, in the nitride semiconductor device 113 according to the third embodiment, since the third semiconductor layer (GaN) 5 other than the region immediately below the first electrode 10 that is the gate electrode is removed, the increase in the ohmic resistance due to the presence of GaN can be suppressed.

In the method for manufacturing the nitride semiconductor device 113, before the epitaxial growth of the fourth semiconductor layer 6 shown in FIG. 8B is performed, thermal cleaning may be performed on the second semiconductor layer (AlGaN) 4 shown in FIG. 8A. The thermal cleaning is a treatment in which the support substrate 1 with the second semiconductor layer 4 exposed is put into a furnace for performing epitaxial growth and heated to a prescribed temperature to remove oxides and the like at the surface of the second semiconductor layer 4.

In the case where thermal cleaning is performed on the second semiconductor layer 4, the surface of the second semiconductor layer 4 is slightly removed.

Figure 11:
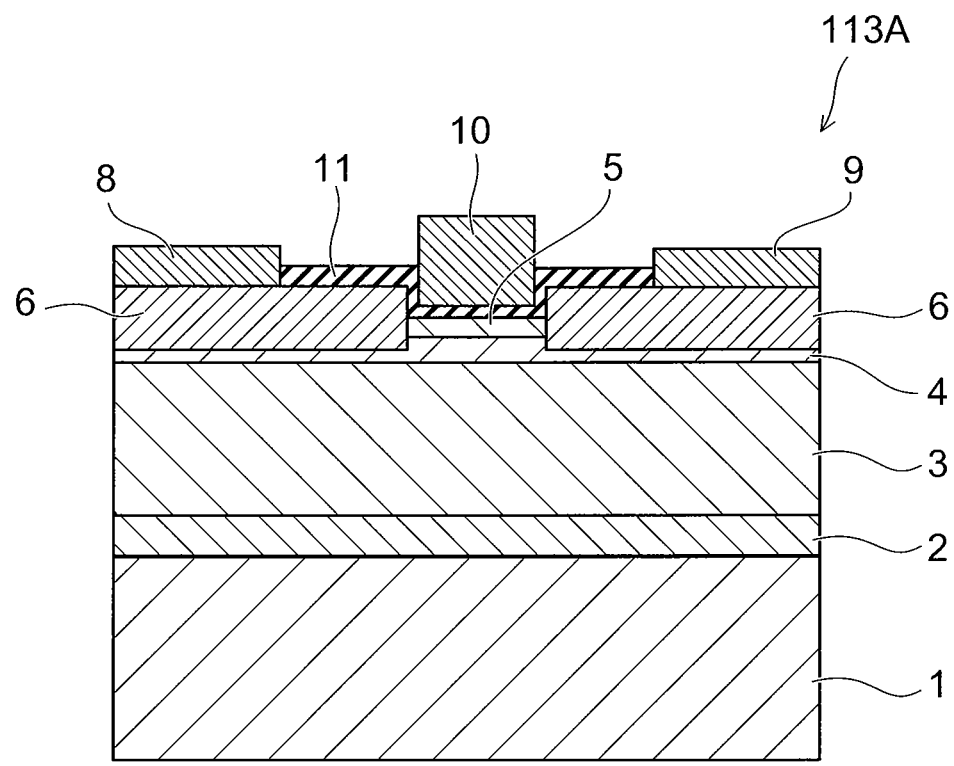
FIG. 11 is a schematic cross-sectional view illustrating another example of the nitride semiconductor device according to the third embodiment.

FIG. 11 is a schematic cross-sectional view illustrating another nitride semiconductor device according to the third embodiment.

In a nitride semiconductor device 113A shown in FIG. 11, thermal cleaning is performed on the second semiconductor layer 4.

Therefore, the thickness of the second semiconductor layer 4 immediately below the fourth semiconductor layer 6 is thinner than the thickness of the second semiconductor layer 4 immediately below the first electrode 10.

Oxides and the like at the surface of the second semiconductor layer 4 are removed by the thermal cleaning of the second semiconductor layer 4, and the fourth semiconductor layer 6 is epitaxially grown in this state. Therefore, during the growth of the fourth semiconductor layer 6, the generation of a crystal defect can be suppressed and a nitride semiconductor device 113A with a limited risk of characteristic abnormality and characteristic variation can be obtained.

Fourth Embodiment

Figure 12:
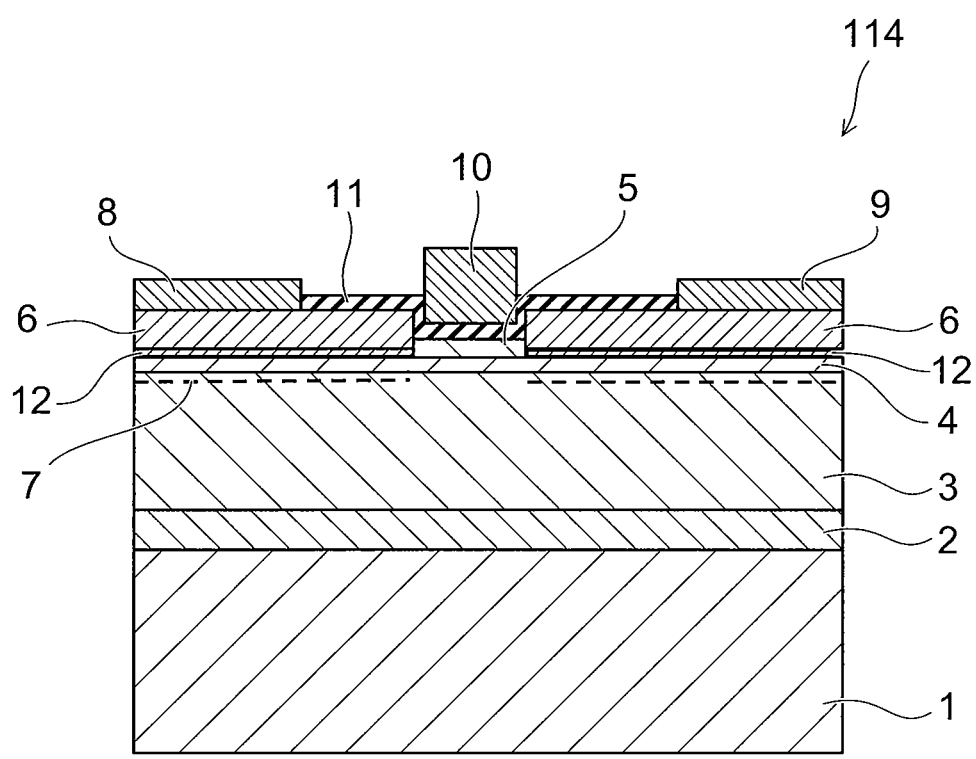
FIG. 12 is a schematic cross-sectional view illustrating a nitride semiconductor device according to a fourth embodiment.

FIG. 12 is a schematic cross-sectional view illustrating a nitride semiconductor device according to a fourth embodiment.

In regard to a nitride semiconductor device 114 according to the fourth embodiment, a description is given mainly about the difference with the nitride semiconductor device 113 according to the third embodiment.

The nitride semiconductor device 114 includes the fifth semiconductor layer 12 between the second semiconductor layer 4 and the fourth semiconductor layer 6.

The fifth semiconductor layer 12 is similar to that of the nitride semiconductor device 112 according to the second embodiment. That is, the fifth semiconductor layer 12 includes an n-type nitride semiconductor. The fifth semiconductor layer 12 preferably has a thickness of, for example, 5 nm or less.

Providing the fifth semiconductor layer 12 allows the trap level at the regrowth interface to be corrected. That is, in the case where the fourth semiconductor layer 6 is grown in a crystalline manner on the second semiconductor layer 4 as in the case of the nitride semiconductor device 113 according to the third embodiment, there is a possibility that trap levels will be formed in a small number at the regrowth interface. Hence, by providing the fifth semiconductor layer 12 that is a highly doped layer between the second semiconductor layer 4 and the fourth semiconductor layer 6, the trap level at the regrowth interface can be corrected.

That is, the fifth semiconductor layer 12 facilitates the re-release of carriers trapped. Furthermore, since the fifth semiconductor layer 12 prevents an electric field from being applied to the regrowth interface, carrier trapping occurs less easily. Therefore, a nitride semiconductor device 114 with a limited risk of characteristic variation can be obtained.

Embodiments are described above, but the invention is not limited to these examples. For example, although a description is given using a combination of AlGaN and GaN as semiconductor layers in the embodiments, also combinations such as GaN and InGaN, and AlN and AlGaN may be used.

Furthermore, the structure and thickness of the buffer layer 2 are arbitrary to the extent that a GaN layer or the like with good crystal quality can be formed thereon. In addition, also the support substrate 1 is arbitrary to the extent that a GaN layer or the like with good crystal quality can be formed.

Moreover, although examples of the field effect transistor are described in the embodiments, the embodiments can be easily applied to other elements such as Schottky barrier diodes.

As described above, by the nitride semiconductor device and the method for manufacturing the same according to the embodiments, in the case where a recess structure is formed by the regrowth of a semiconductor layer, the formation of a defect at the regrowth interface can be suppressed, and a normally OFF nitride semiconductor device with a limited risk of variation in the threshold can be obtained. Therefore, a nitride semiconductor device with stable characteristics can be provided.

Hereinabove, embodiments and variations thereof are described. However, the invention is not limited to these examples. For example, one skilled in the art may appropriately make additions, removals, and design changes of components to the embodiments or the variations described above, and may appropriately combine features of the embodiments; such variations also are included in the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
a first semiconductor layer including a nitride semiconductor;
a second semiconductor layer provided on the first semiconductor layer, the second semiconductor layer having a band gap not less than a band gap of the first semiconductor layer, and the second semiconductor layer including a nitride semiconductor;
a third semiconductor layer provided on the second semiconductor layer, the third semiconductor layer being GaN;
a fifth semiconductor layer provided on the third semiconductor layer and having an interspace over a part of the third semiconductor layer, the fifth semiconductor layer including an n-type nitride semiconductor;
a fourth semiconductor layer provided on the fifth semiconductor layer, the fourth semiconductor layer having a band gap not less than a band gap of the second semiconductor layer, and the fourth semiconductor layer including a nitride semiconductor;
a first electrode provided on the third semiconductor layer;
a second electrode provided on one side of the first electrode on the fourth semiconductor layer and joined to the fourth semiconductor layer by ohmic junction; and
a third electrode provided on another side of the first electrode on the fourth semiconductor layer and joined to the fourth semiconductor layer by ohmic junction,
wherein the second, third, and fourth semiconductor layers cause a two-dimensional electron gas to be formed at an interface of the first semiconductor layer and the second semiconductor layer if a thickness of any one of the three, or a combined thickness of the three, is greater than a predetermined thickness, and
the thicknesses of the second and third semiconductor layers are such that the second and third semiconductor layers do not cause a two-dimensional electron gas to be formed at an interface of the first semiconductor layer and the second semiconductor layer, and a thickness of the fourth semiconductor layer is such that a two-dimensional electron gas is caused to be formed at a portion of the interface of the first semiconductor layer and the second semiconductor layer that is underneath the fourth semiconductor layer.

2. The device according to claim 1, wherein the fifth semiconductor layer includes $Al_mGa_{1-m}N$ ($0 \le m \le 1$).

3. The device according to claim 1, wherein
the first semiconductor layer includes $Al_XGa_{1-X}N$ ($0 \le X \le 1$),
the second semiconductor layer includes $Al_YGa_{1-Y}N$ ($0 \le Y \le 1$, $X \le Y$), and
the fourth semiconductor layer includes $Al_ZGa_{1-Z}N$ ($0 \le Z \le 1$, $X \le Z$).

4. The device according to claim 1, further comprising an insulating layer provided between the first electrode and the third semiconductor layer.

5. The device according to claim 1, wherein the first electrode is joined to the third semiconductor layer by Schottky junction.

6. The device according to claim 1, wherein the first semiconductor layer includes a channel in a normally OFF transistor.

7. The nitride semiconductor device according to claim 1, wherein the fifth semiconductor layer is in direct contact with both the third semiconductor layer and the fourth semiconductor layer.

8. The nitride semiconductor device according to claim 1, wherein the fifth semiconductor layer has a thickness that is five nanometers or less.

9. The nitride semiconductor device according to claim 8, wherein the fifth semiconductor layer is a single layer.

10. The nitride semiconductor device according to claim 1, wherein
   the second semiconductor layer has a part provided between the first electrode and the first semiconductor layer,
   the third semiconductor layer has a part provided between the first electrode and the first semiconductor layer, and
   the part of the second semiconductor layer and the part of the third semiconductor layer have a combined thickness which does not generate the two-dimensional electron gas at the interface between the first semiconductor layer and the second semiconductor layer.

* * * * *